United States Patent [19]
Cho et al.

[11] Patent Number: 6,093,638
[45] Date of Patent: Jul. 25, 2000

[54] METHOD OF FORMING AN ELECTRICAL CONTACT IN A SUBSTRATE

[75] Inventors: Chih-Chen Cho, Richardson; Kyung-Ho Park, Dallas, both of Tex.

[73] Assignee: Texas Instruments Incorporated, Dallas, Tex.

[21] Appl. No.: 09/210,063

[22] Filed: Dec. 10, 1998

Related U.S. Application Data

[60] Provisional application No. 60/069,381, Dec. 12, 1997.
[51] Int. Cl.[7] .................................................. C23C 16/34
[52] U.S. Cl. ......................... 438/627; 438/628; 438/637; 438/643; 438/644; 438/648; 438/653; 438/654; 438/656; 438/680; 438/685; 427/255.394
[58] Field of Search ..................... 427/255.391, 255.394, 427/255.4; 438/627, 628, 637, 643, 644, 648, 653, 654, 656, 680, 685

[56] References Cited

U.S. PATENT DOCUMENTS

| | | | |
|---|---|---|---|
| 5,462,895 | 10/1995 | Chen | 438/654 |
| 5,508,066 | 4/1996 | Akahori | 427/571 |

OTHER PUBLICATIONS

Jeong Soo Byun, Chang Reol Kim, Kwan Goo Rha, Jae Jeong Kim and Woo Shik Kim, "TiN/TiS$_2$ Formation using TiSi$_x$ Layer and Its Feasibilities in ULSI," Jpn. J. Appl. Phys. vol. 34 (1995) pp. 982–986, Rec'd Sep. 12, 1994; Pub. Nov. 19, 1994.

Jeong Soo Byun, Jun Ki Kim, Jin Won Park and Jae Jeong Kim, "W as a Bit Line Interconnection in Capacitor–Over–Bit–Line (COB) Structured Dynamic Random Access Memory (DRAM) and Feasible Diffusion Barrier Layer," Jpn. J. Appl. Phys. vol. 35 (1996) pp. 1086–1089, Part I, No. 2B, Feb. 1996, Rec'd Sep. 19, 1995; Pub. Nov. 9, 1995.

*Primary Examiner*—Timothy Meeks
*Attorney, Agent, or Firm*—Robby T. Holland; Carlton H. Hoel; Frederick J. Telecky, Jr.

[57] ABSTRACT

A TiN$_x$ layer is formed by disposing a substrate (18) in a chamber (12). A first reactant gas (40) comprising Ti, a second reactant gas (42) and a third reactant gas (44) comprising N are introduced into the chamber (12). By controlling the ratio of the first, second and third reactant gasses (40, 42, 44), TiN$_x$ is deposited onto a surface (28) of the substrate (18), where x is between zero and one.

1 Claim, 2 Drawing Sheets

METHOD OF FORMING AN ELECTRICAL CONTACT IN A SUBSTRATE

This application claims priority under 35 USC 119(e)(1) of provisional application number 60/069,381 filed Dec. 12, 1997.

TECHNICAL FIELD OF THE INVENTION

This invention relates generally to electrical devices, and more particularly to a method of forming a $TiN_x$ layer using chemical vapor deposition (CVD).

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on a substrate as part of an integrated circuit. In the integrated circuit, vertical contacts are often used to interconnect different layers and devices formed at different levels. It is desirable that the contacts have high thermal stability so that high contact reliability can be achieved and high temperature processes can be used after the contacts are formed.

One type of contact provides an interconnect between a silicon region and other region or device of the integrated circuit. This type of contact generally includes an adhesive layer that will adhere well to a contact hole in which the contact is formed and a silicide region that will reduce resistance of the contact at the silicon region. A typical contact includes titanium nitride (TiN) for the adhesive layer and titanium silicide ($TiSi_2$) for the silicide region. The contact is formed by sputtering titanium into a contact hole and annealing the deposited titanium to form the titanium silicide. Titanium is then reactively sputtered in nitrogen/argon ($N_2$/Ar) to form the adhesive layer. Tungsten (W) or other conductor is deposited on the adhesive layer to complete the contact. This contact, however, is not stable at temperatures above 800° C.

To improve thermal stability of the contact, a $TiN_x$ layer has been sputter deposited to form the adhesive layer. The use of $TiN_x$, however, has been limited due to poor step coverage in high aspect ratio contact holes. Even with collimated sputtering, it is difficult to deposit $TiN_x$ into small and deep contact holes.

SUMMARY OF THE INVENTION

In accordance with the present invention, a method of forming a $TiN_x$ layer is provided that substantially eliminates or reduces disadvantages or problems associated with previously developed systems and methods. In particular, the present invention provides a method of forming a $TiN_x$ layer using chemical vapor deposition (CVD).

In one embodiment, the $TiN_x$ layer is formed by disposing a substrate in a chamber. A first reactant gas comprising Ti, a second reactant gas and a third reactant gas comprising N are introduced into the chamber. The first, second and third reactant gases are reacted to deposit $TiN_x$ onto a surface of the substrate, where x is between zero and one.

Technical advantages of the present invention include providing an improved method of forming a $TiN_x$ layer. In particular, the $TiN_x$ layer is deposited using chemical vapor deposition (CVD). As a result, the $TiN_x$ layer may be deposited into high aspect ratio contact holes with subquarter micrometer design rule.

Another technical advantage of the present invention includes providing an improved barrier layer for an electrical contact. In particular, a barrier layer is formed by chemical vapor deposition of $TiN_x$. The $TiN_x$ in a resulting barrier layer is in amorphous form that provides a better barrier than columanar materials between silicon and a conductor material.

Still another technical advantage of the present invention includes providing an improved elongated electrical contact formed in a high aspect ratio contact hole. In particular, the elongated electrical contact includes a $TiN_x$ barrier layer with good step coverage in the high aspect ratio contact hole. As a result, the elongated electrical contact is thermally stable.

Other technical advantages will be readily apparent to one skilled in the art from the following figures, description, and claims.

BRIEF DESCRIPTION OF THE DRAWINGS

For a more complete understanding of the present invention, and its advantages thereof, reference is now made to the following description taken in conjunction with the accompanying drawings in which.

DETAILED DESCRIPTION OF THE INVENTION

Figure 1:
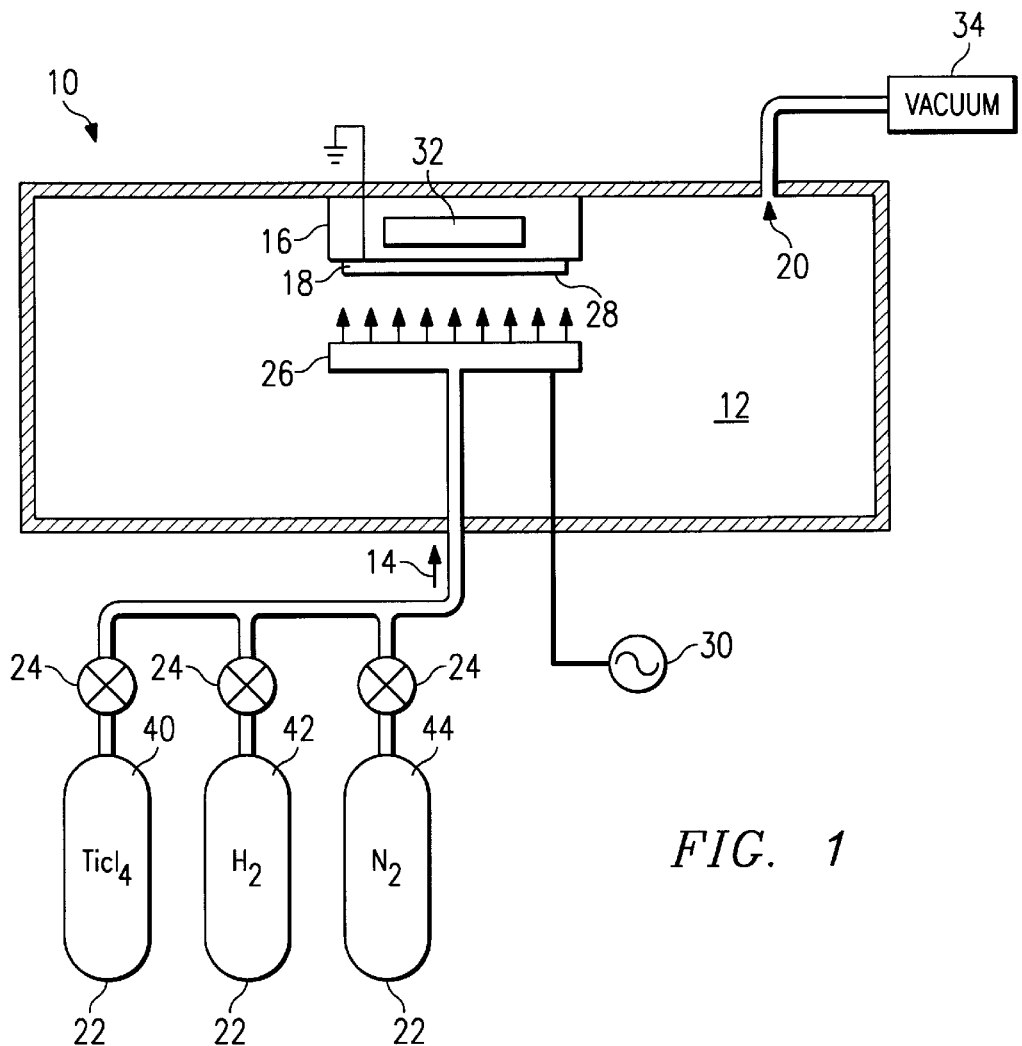
FIG. 1 is a schematic block diagram illustrating a plasma-enhanced chemical vapor deposition (PECVD) reactor and associated equipment for depositing the $TiN_x$ layer of the present invention.

FIG. 1 is a schematic diagram illustrating a plasma-enhanced chemical vapor deposition (PECVD) reactor 10 for depositing a $TiN_x$ layer in accordance with one embodiment of the present invention. The PECVD reactor 10 utilizes plasma to transfer energy to reactant gases and consequently allows a substrate to remain at lower temperature than other CVD processes. In addition, the PECVD reactor 10 provides enhanced deposition rates compared to CVD processes that rely exclusively on thermal reactions. It will be understood that other types of suitable CVD reactors that provide films having good adhesion and step coverage may be used to deposit the $TiN_x$ layer. For example, the $TiN_x$ layer may be deposited using a low-pressure chemical vapor deposition (LPCVD) reactor.

Referring to FIG. 1, the reactor 10 comprises a hermetically sealed chamber 12, an inlet port 14 for introducing reactants into the chamber 12, a plate 16 for holding a substrate 18 in the chamber 12 and an outlet port 20 for evacuating the chamber 12. The inlet port 14 is connected to a plurality of reactant gas stores 22. Each gas store 22 includes a metering device 24 to control the introduction of reactant gases into the chamber 12. It will be understood that reactant gases may be otherwise provided to the chamber 12 as long as the ratios of the reactant gases in the chamber 12 can be adequately controlled.

The inlet port 14 is connected to a "shower head" manifold 26 in the chamber for dispersing reactant gases equally across a surface 28 of the substrate 18. The manifold 26 is connected to a radio frequency (rf) source 30 for generating plasma (glow discharge) to transfer energy to reactant gases in the chamber 12. It will be understood that plasma may be otherwise generated and introduced into the chamber 12 without departing from the scope of the present invention. For example, plasma may be generated by magnetically-assisted rf or microwave sources.

The plate 16 is grounded and includes clips (not shown) or other suitable means to secure the substrate 18 over the manifold 26. The substrate 18 may be a wafer, silicon slice or any other work piece onto which thin films are deposited. A heater 32 is provided in the plate 16 to transfer thermal energy to reactant gases at the surface 28 of the substrate 18. The plate 16 is typically made of graphite while the heater may be an rf or resistive heater. It will be understood that the reactant gases may be otherwise heated without departing from the scope of the present invention. For example, the chamber 12 may be a hot wall tube chamber.

The outlet port 20 is connected to a vacuum pump 34. The vacuum pump 34 typically evacuates and maintains the chamber 12 at a low pressure in the range of about 0.4 to about 8 torr. It will be understood that the reactor 10 may comprise other components or be otherwise suitably configured without departing from the scope of the present invention. For example, the reactor 10 may be a parallel plate PECVD reactor capable of processing a plurality of substrates at a time.

In accordance with the present invention, the reactor 10 is used to form a TiN$_x$ layer on the surface 28 of the substrate 18. As a result, the TiN$_x$ layer may be deposited into high aspect ratio contact holes with subquarter micrometer design rule. In addition, the TiN$_x$ layer is in an amorphous form that provides an improved barrier between materials.

In operation, the chamber 12 is initially evacuated through the outlet port 20, the heater 32 is activated, reactant gases are introduced through the inlet port 14 and plasma is generated from the rf source 30. A first reactant gas 40, second reactant gas 42 and third reactant gas 44 are introduced into the chamber 12 through metering devices 24 and the manifold 26. The first reactant gas 30 may be TiCl$_4$, Ti(CH$_3$)$_4$, Ti(C$_2$H$_5$)$_4$, TiI$_4$ or any other gas comprising titanium (Ti) that can provide high enough vapor pressure. The second reactant gas 42 may be H$_2$ or any other gas capable of reducing the first reactant gas 40. The third reactant gas may be N$_2$, NH$_3$ or any other gas comprising nitrogen (N) that can be reacted with the reduced Ti to deposit TiN$_x$ on the surface 28 of the substrate 18.

In one embodiment, the first reactant gas is TiCl$_4$, the second reactant gas is H$_2$ and the third reactant gas is N$_2$. In this embodiment, the TiN$_x$ layer is deposited at a temperature in the range of about 450° C. to about 650° C. in accordance with the following chemical reaction, where x is between 0 and 1:

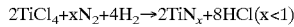

$$2TiCl_4 + xN_2 + 4H_2 \rightarrow 2TiN_x + 8HCl (x<1)$$

Thus, the ratio of N in the TiN$_x$ layer is controlled by controlling the reaction of the N$_2$ with the TiCl$_4$ gas in the chamber 12. In one embodiment, x may be in the range of 0.5 to 0.7, and more particularly about 0.6. In this embodiment, the Ti rich TiN$_x$ layer will have six (6) parts N for each ten (10) parts Ti. As described in more detail below, the Ti rich TiN$_x$ layer is thermally stable and may be used to form an electrical contact and other components of an integrated circuit.

The rate at which the TiCl$_4$, H$_2$ and N$_2$ reactant gases are metered into the chamber 12 is based on the stoichiometric ratios of the gases in the above equation. Thus, two parts TiCl$_4$ and four parts H$_2$ are introduced for each x part N$_2$. It will be understood that the rate at which the reactant gases are metered into the chamber 12 may be varied as necessary to obtain the desired value of x in the TiN$_x$ layer and may depend on the configuration of the reactor 10. It will be further understood that the temperature of the reaction may be varied depending on the type of reactant gases and the plasma energy provided for the reaction.

Figure 2A:
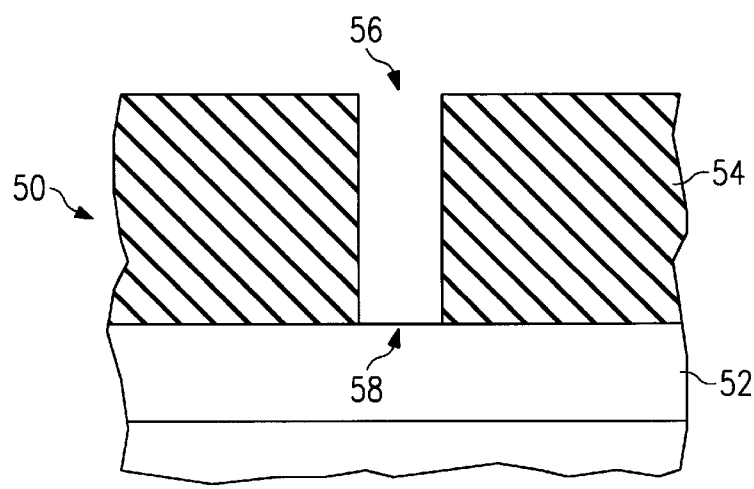
FIGS. 2A–D are a series of schematic cross-sectional diagrams illustrating fabrication of an electrical contact having a $TiN_x$ barrier layer formed in accordance with the present invention.

FIGS. 2A–D are a series of schematic cross-sectional diagrams illustrating fabrication of an electrical contact with a TiN$_x$ layer formed by chemical vapor deposition (CVD) in accordance with the present invention. Referring to FIG. 2A, a substrate 50 comprises a silicon layer 52 and an insulation layer 54 formed outwardly of the silicon layer 52. The silicon layer 52 may be formed of polysilicon, epitaxial silicon or any other type of suitable silicon material. The insulation layer 54 may be formed of oxide, nitride or any other suitable insulative material.

A contact hole 56 is formed in the insulation layer 54 exposing a silicon region 58 of the silicon layer 52. The contact hole 56 may have a high aspect ratio greater than or equal to three. In this embodiment, the height of the contact hole will be three times the width of the contact hole. The high aspect ratio contact hole 52 may be conventionally patterned and etched using suitable photolithographic processing and anisotropic etching techniques.

Figure 2B:
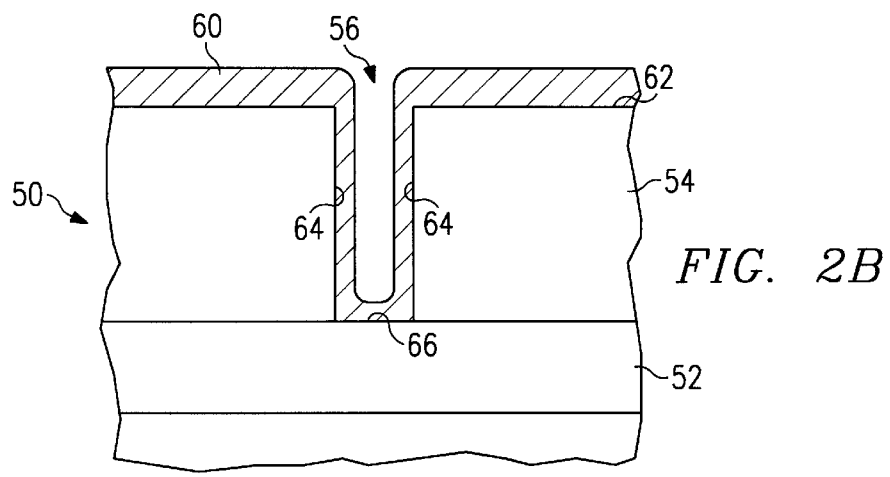

Referring to FIG. 2B, a TiN$_x$ barrier layer 60 is deposited on a surface 62 of the substrate 50 and on a surface 64 of the contact hole 56 using the PECVD reactor 10 and process previously described in connection with FIG. 1. The TiN$_x$ barrier layer 60 has a thickness on a bottom 66 of the contact hole 56 of about 200 angstroms. It will be understood that the thickness and step coverage of the TiN$_x$ barrier layer 60 may be suitably varied depending on the geometry of the contact hole 56. It will be understood that the TiN$_x$ barrier layer 60 may be otherwise deposited using suitable chemical vapor deposition (CVD) processes and equipment.

In a particular embodiment, the value of x in the TiN$_x$ barrier layer 60 is about 0.6. The TiN$_{0.6}$ layer forms a thermally stable barrier layer 60 that will not degrade after annealing at 800° C. for one hour. It will be understood that the value of x in the TiN$_x$ barrier layer 60 may be varied depending on the materials of the contact and further processing steps of the substrate 50 as long as the resulting barrier layer is thermally stable for the application in which the contact is employed.

Figure 2C:
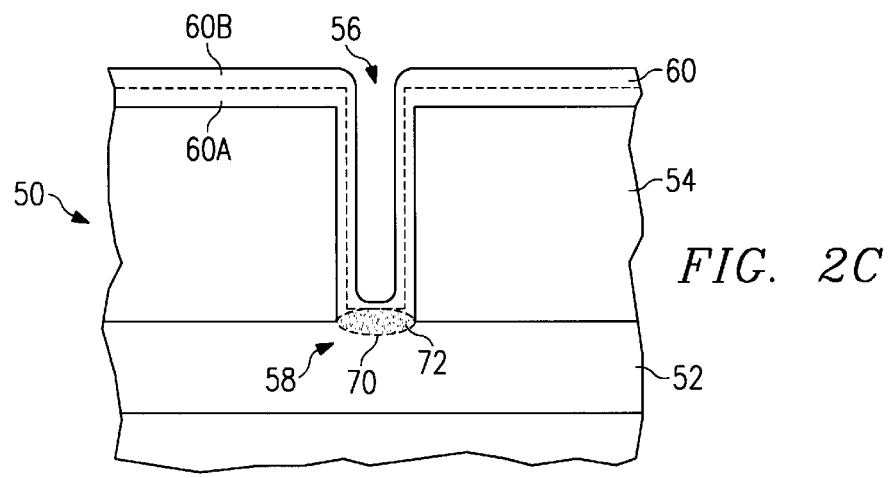

Referring to FIG. 2C, a bottom portion 70 of the TiN$_x$ barrier layer 60 is reacted with the silicon region 56 to form a silicide region 72. The silicide region 72 lowers contact resistance between the silicon layer 52 and the contact. According to one embodiment, the barrier layer 60 is reacted with the silicon region 56 by annealing the substrate 50 at a temperature of about 700° C. for a time period of about 30 seconds. During the anneal, Ti is depleted from the bottom portion 70 of the TiN$_x$ barrier layer 60 and reacts with Si from the silicon region 58 to form TiSi$_2$ of the silicide region 72. It will be understood that the silicide region 72 may be otherwise formed without departing from the scope of the present invention.

Figure 2D:
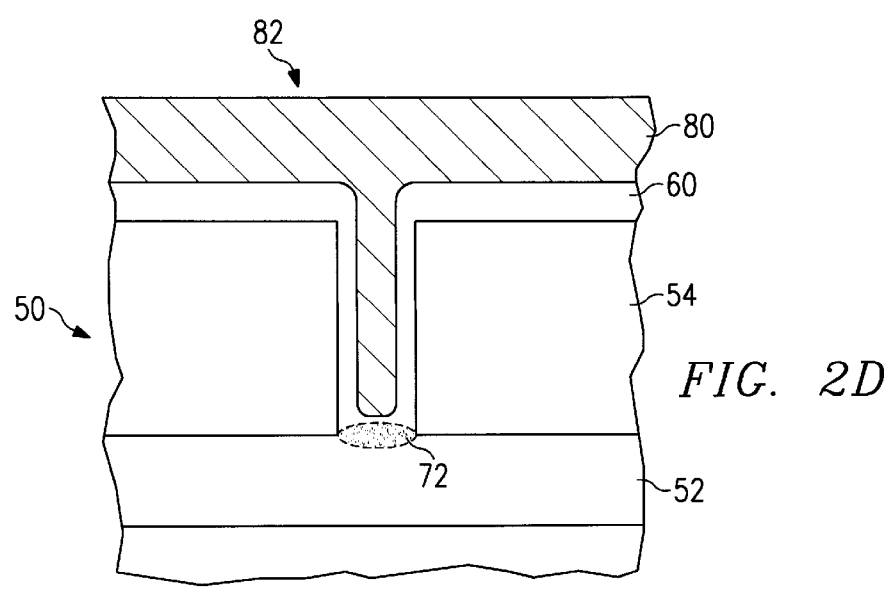

Referring to FIG. 2D, a conductive layer 80 is deposited outwardly of the TiN$_x$ barrier layer 60 to fill the remaining portion of the contact hole 56 and complete the contact 82. The conductive layer 80 may be formed of a metal such as tungsten (W) conventionally deposited to a thickness in the range of 100 nanometers to 400 nanometers. It will be understood that the conductive layer 80 may be otherwise formed using suitable techniques without departing from the scope of the present invention.

According to a particular embodiment, the TiN$_x$ barrier layer 60 comprises separate deposited sublayers 60A and 60B (See FIG. 2C). In this embodiment, the first sublayer 60A is formed of TiN$_x$ where x<0.3. After the first sublayer 60A is deposited, the substrate is annealed to form the silicide region 72. The resulting silicide region 72 has a small amount of N(1–5%) and improved thermal stability. The second sublayer 60B formed of TiN$_x$ where x is about 0.6 is then deposited outwardly of the first sublayer 60A and silicide region 72 to complete the barrier layer 60.

Although the present invention has been described with several embodiments, various changes and modifications may be suggested to one skilled in the art. It is intended that the present invention encompass such changes and modifications as fall within the scope of the appended claims.

What is claimed is:

1. A method of forming an electrical contact in a substrate, comprising the steps of:

providing a substrate comprising a contact hole exposing a silicon region;

forming a barrier layer outwardly of the substrate and a surface of the contact hole, the step of forming the barrier layer comprising the steps of:

disposing the substrate in a chamber;

introducing a first reactant gas comprising Ti into the chamber;

introducing a second reactant gas into the chamber;

introducing a third reactant gas comprising N into the chamber;

responsive to introducing the first, second and third reactant gases, reacting the first, second and third reactant gases;

responsive to the step of reacting the first, second and third reactant gases, depositing TiN$_x$ on a surface of the substrate and the surface of the contact hole, where x is between 0 and 1;

forming a conductive layer outwardly of the barrier layer; and wherein the stop of forming the barrier layer further comprises the steps of:

forming a first sublayer by depositing TiN$_x$ on the surface of the substrate and the surface of the contact hole, where x is about 0.3; and forming a second sublayer by depositing TiN$_x$ outwardly of the first sublayer, where x is about 0.6.

* * * * *